United States Patent [19]

Hall

[11] 4,383,026

[45] May 10, 1983

[54] ACCELERATED PARTICLE LITHOGRAPHIC PROCESSING AND ARTICLES SO PRODUCED

[75] Inventor: Thomas M. Hall, Warren, N.J.

[73] Assignee: Bell Telephone Laboratories, Incorporated, Murray Hill, N.J.

[21] Appl. No.: 295,690

[22] Filed: Aug. 24, 1981

Related U.S. Application Data

[63] Continuation of Ser. No. 44,073, May 31, 1979, abandoned.

[51] Int. Cl.$^3$ .............................................. G03C 5/00
[52] U.S. Cl. .................................... 430/325; 430/293; 430/320; 430/321; 156/643; 250/492.2; 250/492.3; 427/43.1; 365/1
[58] Field of Search .............. 430/302, 293, 325, 320, 430/321; 156/643; 250/492.2, 492.3; 427/43.1; 365/1

[56] References Cited

U.S. PATENT DOCUMENTS

| | | | |
|---|---|---|---|
| 3,143,423 | 8/1964 | Reynolds et al. | 430/296 |
| 3,529,960 | 9/1970 | Sloan | 430/296 |
| 3,770,433 | 1/1973 | Bartelt et al. | 430/296 |
| 3,816,198 | 6/1974 | LaCombe et al. | 156/643 |
| 4,015,986 | 4/1977 | Paal et al. | 156/643 |
| 4,056,395 | 11/1977 | Sato et al. | 430/296 |
| 4,061,799 | 12/1977 | Brewer | 427/43 |
| 4,088,896 | 5/1978 | Elkins et al. | 250/492.2 |
| 4,101,782 | 7/1978 | Seliger | 427/36 |
| 4,133,907 | 1/1979 | Brewer | 430/296 |
| 4,289,845 | 9/1981 | Bowden et al. | 430/296 |

OTHER PUBLICATIONS

Thompson, Solid State Technology, pp. 27-30 and 40, Jul. 1974.
Hatzakis, J. Electrochem. Soc., vol. 116, pp. 1033-1037, Jul. 1969.
Seliger et al., Journal of Applied Physics, vol. 45, No. 3, Mar. 1974, pp. 1416-1422.
Paal et al., "New High Sensitive Electron Resist Material", Solid-State Science & Technology, Dec. 1973, pp. 1714-1716.
Kaplan et al., IBM Tech. Disc. Bull, vol. 21, No. 7, Dec. 1978.
Brewer, "Review of Electron & Ion Beams for Microelectronics Applications", Fourth International Conference on Electron and Ion Beam Science & Technology, pp. 455-480, 1970.

*Primary Examiner*—J. Travis Brown
*Attorney, Agent, or Firm*—George S. Indig; Peter A. Businger

[57] ABSTRACT

Ion beam lithography of particular interest in the fabrication of large-scale integrated circuits of unexpectedly increased throughput results from appropriate choice of (a) resist material and (b) ion species. Resist material, generally negative acting, is characterized by electron beam sensitivity inadequate for ordinary commercial electron beam lithography. The relevant characteristic responsible for inadequate electron beam sensitivity is the very characteristic responsible for enhanced ion sensitivity. Ion species, always of atomic number greater than that of proton, are dictated by the observation that sensitivity unexpectedly increases at a greater rate than predictable on traditional bases.

24 Claims, No Drawings

ACCELERATED PARTICLE LITHOGRAPHIC PROCESSING AND ARTICLES SO PRODUCED

This is a continuation, of application Ser. No. 044,073, filed May 31, 1978, now abandoned.

BACKGROUND OF THE INVENTION

Technical Field

Small circuits or circuit elements of feature size of the order of a few micrometers or smaller generally undergo one or more lithographic delineation steps in fabrication. One such category of circuits often fabricated in and on epitaxial silicon is known as large scale integration (LSI). Prevalent manufacture is based on sets of discrete masks patterned by means of ultraviolet light, electron beam or other actinic radiation. An alternative approach, known as "direct processing" is based on primary pattern delineation in masking layers affixed directly to the device or circuit during manufacture.

All such processes involve primary or secondary pattern delineation to eventually permit plating, etching or other modification of underlying active material exclusively in bared regions of apertured masking layers.

Silicon integrated circuitry (SIC) is exemplary of the accelerating development of miniaturized devices. MOS (metal oxide semiconductor) LSI's (large scale integration) are illustrative. State of the art circuitry is represented typically by a chip of dimensions of a small fraction of an inch—perhaps ¼ inch square—containing as many as 64,000 individual cells each, in turn, containing a number of individual elements. Design rules—smallest line/space dimensions are now about 3½ micrometers. Such devices are typically fabricated by use of sets of masks with patterns defined in terms of apertured regions in thin chromium layers supported by glass substrates. Mask sets, of perhaps five to fifteen individual masks, serve as primary patterns. Such masks serve to replicate patterns by use of transmitted near UV radiation made incident on suitable actinic material on the device undergoing processing.

Primary pattern generation has gone through a number of stages with sophisticated devices at this time being generated by software control of a monitored travelling beam—generally, an electron beam. Electron sensitive resist material may be negative acting (selectively retained where irradiated) or positive acting. Development of exposed resist is generally wet. The developed pattern is replicated in underlying chromium to result in a so-called "hard" copy mask which is supported on optically polished glass with the entirety serving as the final primary mask.

State of the art replication is showing a trend toward projection printing with replication often 1:1 on the supported photoresist. Once processed, the photoresist then serves to localize any of the various modifications required in fabrication of the device. Examples of such modification include electroplating, ion implantation, etching, etc.

The latter fabrication step—etching—is perhaps the most ubiquitous step in fabrication and, consequently, has represented the largest concentration of developmental effort. Wet etching, generally isotropic by nature, served well and continues to serve where feature dimensions do not approach the usually fractional micrometer layer to be processed. Finer features require directionality, i.e., anisotropic etching, generally with minimal undercutting of resist material. Other considerations, e.g., contamination, ease of removal of spent etchant, etc., give rise to a desire for dry etching, or, more generally, for dry processing.

Dry processing may make use of simple vapor chemical reaction but this, in the usual situation, continues to be isotropic. Anisotropic dry processing generally makes use of directionality imposed by net motion of relevant processing species. In the instance of dry etching, use may be made of plasma environment as in simple plasma etching; directionality may be enhanced by use of a dc bias, as in reactive ion etching or sputter etching, or dependence may be had solely on momentum exchange, as in ion milling.

State of the art devices are controllably fabricated by use of mask technology. Registration ability by present means would seem to permit extension of this technology to design rules of about 2 micrometers or perhaps to about 1 micrometer. Registration precision of masks—typically, several inches in diameter and containing many tens of circuits—is expected to become limiting so that economic considerations may dictate use of a maskless process for small feature size—perhaps for design rules at about 1 micrometer.

Maskless processing, sometimes known as "direct processing", depends upon primary pattern delineation from software directly on a resist layer intimately supported by the device undergoing processing. Direct processing imposes new requirements both on lithographic apparatus and on resist. Apparatus, in addition to high resolution capability, must, in the usual case, be capable of a throughput much more rapid than that expedient for mask production. Design improvisation depending, for example, on shaped, nonGaussian beams, would appear to be a significant part of the solution. Increased throughput gives rise to a requirement for shortened exposure. Exposure depends upon lithographic sensitivity of the resist and brightness of the source. Considerable effort is being directed toward improvement of both.

Primary pattern delineation implies the need for controllably moving and modulating a focused beam of radiation. Most advanced apparatus depends upon electron beam. Materials of sensitivity adequate for mask making have been developed and are now off-the-shelf items. Electron sources, generally tungsten or thorated tungsten, may soon yield to lower work function thermionic emitter materials, such as, lanthanum haxaboride; or may take the form of high density field emitters. The prevailing view is that one or the other approach coupled with newly emerging resist materials will satisfy lithographic requirements certainly through the expected generations of mask fabrication and likely into direct processing.

There has, for some years, been an ongoing interest in the possibility of delineating beams of larger atomic particles. In general, means for generating, accelerating, focusing, and otherwise controlling charged ions have been adequate for production of micron and smaller diameter beams. Development over recent years has been largely directed toward increasing brightness, so that, at this time, means have been described for production of 1 to 1/10 micron diameter beams at 1 amp/cm$^2$—representing deposited energy comparable to that of presently used electron beams. Apparatus which has been reported in the literature shows promise of requisite scan rates, focusing, modulation, etc., but it does appear that, for some time, available incident power will continue to be only comparable to electron beam.

It is believed that ion lithography offers potential advantages. A variety of considerations lead to the possibility of improved resolution. A main basis for this expectation is the absence of backscattering of lithographic significance. For the most part, ions are not captured and cannot, therefore, backscatter; while secondary electrons are of significantly lower velocity than the primary electrons used in e-beam lithography. For the most part, it has been assumed that the most promising ion resists would be chosen from among the best electron resists. This continues to be the general consensus and, in fact, the most sensitive e-beam resists are shown to be most sensitive for ion exposure, as well. A problem in ion beam lithography common with that already experienced with electron beam lithography has to do with the need for improved stability, for example, in a variety of processing environments. In e-beam lithography, design to accomplish this end has generally resulted in a loss in sensitivity. So, for example, inclusion of an aryl moiety in the prevalent "COP" (copolymer of glycidyl methacrylate with ethyl acrylate) while increasing processing stability results in the expected decrease in lighographic sensitivity.

SUMMARY OF THE INVENTION

1. Problem

Ion beam lithography is not now a commercial alternative to electron beam lithography. Equipment, potentially comparable in terms of scan rate, modulation, deposited energy, etc., is under development. Resists generally chosen from among commercially accepted e-beam resists would, together with such apparatus, offer results equivalent to those available from e-beam. Characteristics of the two systems are different, and it does appear that ion beam offers some improvement in resolution largely due to absence of back scattering at least when patterning is carried out in simple single layered resist.

There has been no reason to assume that ion beam offers any solution to the expected problems in e-beam for oncoming generations of lithography. Finer resolution—perhaps direct processing—gives rise to a need for improved chemical and physical stability which, for electron beam, has generally implied some loss in lithographic sensitivity.

2. Solution

An unexpected category of negative-acting ion beam resists is made available. The category, exemplified by materials of excellent chemical and physical stability to all usual processing environments, manifests lithographic sensitivity comparable to the best electron beam resists. Availability of this category depends upon the observation that included materials show a nonlinear increasing sensitivity with increasing atomic number (more broadly with deposited energy per particle) than is expected on the basis of traditional calculation. Surprisingly, the category may be defined in terms of lithograhic sensitivity below a value considered acceptable for e-beam lithography. Generally, the category may be so defined as consisting of materials which evidence of lithographic sensitivity no greater than $10^{-5}$ coulombs/cm$^2$ as conveniently measured with 20 keV electrons. (Numerical sensitivity values in units of coulombs per square centimeter are used here throughout as a measure of sensitivity in conformance with accepted usage. It is noted that, as measured in such units, the sensitivity value associated with a more sensitive material is numerically less and conversely; e.g., a sensitivity value of $10^{-4}$ coulombs per square centimeter corresponds to a material which is less sensitive than a material having a respective value of $10^{-6}$.)

Resist materials of the invention typified, for example, by the novolacs (unmodified by any sensitizer) when delineated by oxygen ion beams have a lithographic sensitivity comparable with that of the best electron resists. Stability of novolac to processing environments is well known, since one composition is identical to that which serves as the base polymer in the most prevalent photoresist. A vast category of other materials, generally not considered for lithographic purposes, are members of the category.

Resists of the invention are suitably utilized in the delineation of primary, as well as replicated, images. Aspects of the invention are in terms of delineation in either category. Since processing stability is an important consideration, preferred embodiments are presented in terms of actual device fabrication in which developed images serve to mask underlying regions during a variety of procedures, such as, dry etching.

DETAILED DESCRIPTION

I. Introduction

The invention is described in terms of:
I. "Introduction",
II. "Resist Composition",
III. "Radiation",
IV. "Postulated Mechanism", and
V. "Examples".

It will be seen that a complete description of the invention depends on a number of interrelated factors. Many arise from the nature of ion lithography, per se, as distinguished from e-beam lithography. Others derive directly from the postulated mechanism which, in fact, is well supported by extensive experiment. Some design information of a fundamental nature is included for the convenience of the artisan who is not familiar with ion beam lithography. Such information, while possibly useful in setting further operating modes, is not otherwise limiting. So, accordingly, suitable structures for free-standing masks are described; although others may serve satisfactorily.

A copending application, Ser. No. 907,873 filed on May 22, 1978, relates to lithography—generally, e-beam lithography—using a category of materials exemplified by modified novolacs. While actinic properties in that copending application are due not to the novolac but to the modifier, certain basic considerations are common. The worker is referred to that description for information concerning, for example, polymer weights, deposition techniques, development, and the like. Reference is made to that application as well for a number of other considerations, such as those relating to mask and device processing. Accordingly, the disclosure of such copending application is incorporated in this description by reference.

II. Resist Composition

With the single exception, suitable resists are to be selected in accordance with considerations familiar to those versed in electron beam lithography. Accordingly, the generally organic polymeric materials are generally dissolved in suitable solvents, are deposited on substrates by a variety of techniques—e.g., spinning, spraying, flooding, etc. Parameters are selected with a view to low defect count, good adhesion, and other considerations—e.g., pollution. Resist layer thickness is likely to be a fraction of a micron—uniformity in thickness is of the same significance as in e-beam. Substrates, too, are as nearly perfect as feasible so that separate masks for subsequent optical use may be considered on optically polished glass substrates, although masks designed for ion replication may take other forms. Freely supported layers are possible but a presently available approach involves oriented silicon substrates along a major crystallographic axis to permit channeling.

Most noteworthy, from the inventive standpoint, is designation of polymers in terms of maximum permitted sensitivity as measured by use of a 20 keV electron beam. In these terms, materials suitable for the inventive purposes necessarily have a sensitivity no greater than $10^{-5}$ coulombs/cm$^2$, and, in some instances, preferably at a maximum of $10^{-4}$ coulombs/cm$^2$. Resists of the invention are all negative acting; and so the category prescribed, while representing materials found suitable in accordance with this teaching, at the same time represents materials no better than an order of magnitude less sensitive than the commercially expedient negative-acting electron beam resists. The designated category will be of particular significance to the worker who is well aware of the fact that materials of greatest processing stability are so included. Since sensitivity, as so defined, is set at a low value relative to better known e-beam resists, moieties of such prior art resists responsible for cross-linking are necessarily absent. Accordingly, compositions of the invention do not include epoxy groupings or other oxiranes or thiranes or non-resonant unsaturation, in general. Experimental work conducted with polystyrene is generally supportive. Materials with reactive moieties not only do not show enhancement as do members of the category, but actually show a somewhat lesser increase in sensitivity than is predicted on the basis of usual considerations. In fact, a corollary of the inventive teaching shows a loss in sensitivity with increasing energy per particle. Experiments conducted on polybutene sulfone on a copolymer of glycidyl methacrylate and chlorostyrene are supportive of the corollary.

Enhancement in sensitivity with increasing particle size may permit a secondary benefit. It is well known that sensitivity of negative resists decreases with decreasing polymer weight. (Lithographically meaningful cross-linking results only from one cross-linking per molecule.) Paradoxically, use of smaller polymer weight results in reduction in swelling during dissolution particularly where organic solvents are used and so permits increased resolution. Use of larger particles may permit smaller polymer molecules.

III. Radiation

Most reported work is based on ionized particles, and it is expected that first commercial use of the invention will use helium ions, oxygen ions, or still heavier ions. Experimental work to date suggests improving lithographic sensitivity with increasing atomic number. Alternatives include molecular beams produced by neutralization of ion beams always, however, or atomic numbers 2 or greater. In general, other conditions are secondary. So, for example, where atmospheric constituents do not play an active chemical role in cross-linking, lithographic exposure is carried out with the resist in a vacuum perhaps of $10^{-5}$ mm of Hg, which is desired for formation and maintenance of the beam.

Discussion in this section has been in terms of focused beams which are necessarily used in primary pattern delineation and which may serve in replication, as well. Second replication may, however, take the form of unfocused acceleration in a manner analogous to the electron imaging projection system (ELIPS).

Certain minor precautions may be indicated by consideration of underlying material. For example, while doses are small and likely to have very little effect on semiconductor substrates, lightly doped material may suggest use of particles which are not electrically active—e.g., helium, neon.

Energies are desirably such that the resist layer is essentially transparent to the particles. Van de Graaf accelerators easily permit meV particles. Low energy accelerators are usefully employed for producing beams of particles of energies of tens of keV's and higher.

IV. Postulated Mechanism

While reliance is not had on a mechanistic explanation, all experiments are supportive of a consistent thesis. Traditionally, low sensitivity negative resists (i.e., low sensitivity e-beam resists) are those with relatively high cross-linking activation energy. It is postulated that such materials require activation at two separate sites to bring about a single cross-linking event. As sensitivity, still measured by electron beam exposure, increases activation energies are decreased such that a single activation results in a moiety which may, itself, react with a near atom to result in a cross-link. Stated in these terms, low sensitivity negative resists are considered as having two site activation mechanisms, while more sensitive resists are considered as having single site activation mechanisms.

The nature of activation resulting from ion bombardment explains the deviation in sensitivity from the expected relationship. For concerned energies, ion stopping is predominantly electronic with secondary electrons being produced at closely spaced intervals during ion traversal. Such secondary electrons are low energy (relative to the primary electrons used in electron beam lithography). Energies of the order of from a fraction to a few keV result in high absorption cross-section enhancing the likelihood of the required two site activation of sites sufficiently close to permit cross-linking. The effect is that of local electron density far greater than can be accomplished in electron beam lithography with any reasonable flux. Conversely, such concentrated flux in the compact volume about the travelling ion is largely wasted for the single site case. Since secondary electron energy is related to ion velocity, the fundamental requirement for high absorption cross-section (low velocity secondary electrons) can be described in terms of such ion velocity. Dependence on increasing atomic number, true for constant velocity particles, as well as for constant energy particles, comes about from the statistical increase in the number of nonelastic collisions per unit penetration distance—that is, increasing ion energy for given velocity results in greater density of secondary electrons.

V. Examples

Example 1: Preparation of a Novolac

A 1,000 ml three-neck round bottom flask equipped with a variable speed mechanical stirrer, a water cooled condenser and a thermometer is charged with the following ingredients: 34.0 grams m-cresol; 136.0 grams o-cresol; 30.0 grams p-t butyl phenol; and 126.2 grams of 37 percent aqueous formaldehyde solution. 1.0 gram of oxalic acid is added as a catalyst and the temperature of the mixture is increased to reflux with continuous stirring. After 10 hours, 0.5 grams of additional catalyst is added and thereafter the reaction is allowed to continue for a further period of ten hours. At this time, the reaction is stopped by removal of the heating means, and the mixture is washed with distilled water. After the aqueous layer is removed by decantation, a condenser is connected to an adapter to permit distillation of the volatile components. A vacuum pump is attached to the reaction vessel, and the novolac is heated slowly under vacuum to minimize foaming. Once the novolac is melted, the stirrer is started and heating is continued until the temperature of the novolac reaches 220 degrees C. It is held at 220 degrees C until the pressure drops to 0.1 mm of mercury, thereby insuring virtually complete removal of the monomers. The vacuum is then released under nitrogen in order to prevent oxidation of the novolac. The molten polymer is then poured into aluminum trays to cool.

The resist solution preparation: Resist solutions are prepared by dissolving 20 grams of the novolac in a solution comprised of 50 percent by volume of methoxy ethyl acetate and 50 percent by volume cyclohexanone. The solutions are then filtered several times through a 0.2 micron teflon filter. A silicon wafer is spin coated at 2,000 rpm with the resist solution. The resulting resist thickness is 1.0 micrometer. The resist coated substrate is prebaked at 120 degrees C. for two hours. A test pattern is produced by use of a 2 meV Van de Graaf accelerator equipped with electrostatic plates for raster scanning. The beam, approximately 1 mm in diameter, is scanned over approximately 1 mm of a 100 mesh grid which is in contact with the coated substrate. Exposure is carried out with three different ions—hydrogen, helium, and oxygen—altering the deposited energy so as to produce lithographically identical images for each ion. Following exposure, the exposed resist coated substrate is baked at 120 degrees C. for fifteen minutes. The development of the exposed film is effected by dipping into a basic aqueous solution of pH 12.6 for three minutes. The patterned resist substrate is then baked at 120 degrees C. for one hour.

Whereas conventional calculation suggests lithographic equivalency results from uniform energy deposition without regard to ionic species, actual results are as follows:
Hydrogen: 198 eV/nm$^3$
Helium: 80 eV/nm$^3$
Oxygen: 23 eV/nm$^3$.

Example 2

Example 1 is repeated, however, substituting polystyrene of weight average molecular weight $M_w$ equals 160,000. Molecular distribution is 2.0; application to produce a 0.8 micrometer film on the silicon wafer is by spinning at 2,000 rpm of 9 percent solution in chlorobenzene. Baking to remove excess solvent is at 150 degrees C. for one hour. Results for equivalent lithographic imaging (½ thickness retention) is as follows:
Hydrogen: 8.4 eV/nm$^3$
Helium: 3.2 eV/nm$^3$
Oxygen: 3.5 eV/nm$^3$.

Note: From a processing standpoint, the small upturn for oxygen relative to helium is of little consequence.

From a mechanistic standpoint, the material exemplifies a resist of low threshold cross-linking—even though necessarily two site—which, therefore, shows some "saturation" effect. For the noted conditions, the number of secondary electrons of energy above threshold is vastly greater than for a higher threshold material so that available cross-linking sites are already activated for helium.

I claim:

1. Process for fabrication of an article comprising an operation during which the article undergoing fabrication comprises an article surface and an overlying actinic processing layer, said processing layer consisting essentially of radiation-sensitive material including the steps of (1) selectively exposing portions of the said processing layer to patterning actinic radiation to define a pattern whereby ease of removal of the said portions of the processing layer by a developing agent is decreased; (2) treating the said processing layer with said developing agent to selectively remove material outside the said portions to produce a now patterned processing layer; (3) treating the article undergoing fabrication with an altering agent which preferentially alters regions of the said article surface corresponding with selectively removed material in the patterned processing layer, CHARACTERIZED IN THAT the said radiation-sensitive material consists essentially of polymeric material which has a lithographic electron beam sensitivity of less than $10^{-5}$ coulomb/cm$^2$ as measured by use of incident 20 keV electrons and in which the said actinic radiation as incident on the said material consists predominantly of charged or uncharged species of atomic number at least equal to 2.

2. Process of claim 1 in which the said altering agent alters the said article surface by removal of material.

3. Process of claim 1 or 2 in which the said altering agent is liquid.

4. Process of claim 1 or 2 in which the said altering agent is nonliquid.

5. Process of claims 1 or 2 in which step (3) is a dry processing step.

6. Process of claim 5 in which the dry processing may be characterized as a procedure selected from the group consisting of ion etching, ion beam, milling, reactive ion etching, plasma etching, reactive sputter etching, sputter etching, gas phase chemical etching, ion implantation, vacuum deposition, sputter deposition, and chemical vapor deposition.

7. Process of claim 6 in which step (3) consists of material removal from the said article surface and in which the dry processing may be characterized as a procedure selected from the group consisting of ion etching, ion beam milling, reactive ion etching, plasma etching, plasma assisted etching, reactive sputter etching, sputter etching, gas phase chemical etching.

8. Process of claim 7 in which the said article includes a silicon circuit element.

9. Process of claim 8 in which the said article is a silicon integrated circuit in which the said article surface undergoing fabrication contains an oxide of silicon and in which step (3) consists of plasma assisted etching.

10. Process of claim 9 in which said altering agent is produced from a gas containing chemically combined or physically admixed fluorine.

11. Process of claim 7 in which the said article is a magnetic circuit.

12. Process of claim 11 in which the said article is a bubble device and in which the said article surface is a magnetic material.

13. Process of claim 12 in which the said magnetic material comprises an alloy of nickel and iron.

14. Process of claim 13 in which the said alloy is permalloy.

15. Process of claim 7 in which the said article is an integrated optic circuit.

16. Process of claim 1 or 2 in which the said polymer has a lithographic electron beam sensitivity of less than $10^{-4}$ coulomb/cm$^2$ as defined.

17. The process of claim 1 or 2 in which the said actinic radiation consists of ions.

18. Process of claim 1 in which the said actinic radiation is focused to form at least one beam which is modulated and scanned relative to the said article undergoing fabrication to define the said pattern.

19. Process of claim 1 or 2 in which selectivity of exposure in step (1) results from nonselective radiation exposure of an apertured mask.

20. Process of claim 1 or 2 in which the said article is a discrete mask.

21. Process of claim 20 in which the said article surface consists essentially of a material selected from the group consisting of chromium and oxidized chromium.

22. Process of claim 1 in which the said radiation-sensitive material consists essentially of novolac.

23. Process of claim 1 in which the said radiation-sensitive material consists essentially of polystyrene.

24. Article produced by the process of claim 1.

* * * * *

UNITED STATES PATENT AND TRADEMARK OFFICE
CERTIFICATE OF CORRECTION

PATENT NO. : 4,383,026

DATED : May 10, 1983

INVENTOR(S) : Thomas M. Hall and Alfred Wagner

It is certified that error appears in the above—identified patent and that said Letters Patent is hereby corrected as shown below:

In the Heading: "Thomas M. Hall, Warren, N. J." should read --Thomas M. Hall, Warren; Alfred Wagner, Berkeley Heights, both of New Jersey--.

Column 1, line 6, "1978" should read --1979--. Column 2, line 49, "haxaboride" should read --hexaboride--. Column 3, line 61, "below" should read --below--.

Signed and Sealed this

Ninth Day of August 1983

[SEAL]

Attest:

GERALD J. MOSSINGHOFF

Attesting Officer

Commissioner of Patents and Trademarks